United States Patent
Ono

(10) Patent No.: US 6,211,017 B1
(45) Date of Patent: Apr. 3, 2001

(54) METHOD OF FABRICATING FLOATING GATE EEPROM

(75) Inventor: Takashi Ono, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/294,361

(22) Filed: Apr. 20, 1999

(30) Foreign Application Priority Data

May 11, 1998 (JP) .................................................. 10-127350

(51) Int. Cl.[7] .............................................. H01L 21/8247
(52) U.S. Cl. ............................................. 438/264; 438/594
(58) Field of Search ...................................... 438/257, 267, 438/593, 594

(56) References Cited

U.S. PATENT DOCUMENTS

| 5,021,848 | | 6/1991 | Chiu . | |
|---|---|---|---|---|
| 5,225,362 | | 7/1993 | Bergemont . | |
| 5,516,713 | * | 5/1996 | Hsue et al. . | |
| 5,527,728 | * | 6/1996 | Ghezzi et al. . | |
| 5,712,179 | * | 1/1998 | Yuan . | |
| 5,817,557 | * | 10/1998 | Baldi | 438/264 |
| 5,863,822 | * | 1/1999 | Kanamori et al. | 438/264 |
| 6,027,972 | * | 2/2000 | Kerber | 438/257 |
| 6,063,667 | * | 5/2000 | Kuo | 438/263 |

FOREIGN PATENT DOCUMENTS

| 6-140517 | 5/1994 | (JP) . |
|---|---|---|
| 6-326198 | 11/1994 | (JP) . |

* cited by examiner

Primary Examiner—Richard Booth
(74) Attorney, Agent, or Firm—Jones Volentine, LLC

(57) ABSTRACT

Upon opening a tunnel window of an EEPROM having a floating gate, a portion of a conductive layer which serves as a floating gate electrode is cut as an opening and side walls are formed on side portions of the opening. A gate insulating film is removed by a self-aligned method using each side wall as a mask, and a thin tunnel oxide is locally formed within the tunnel window.

13 Claims, 4 Drawing Sheets

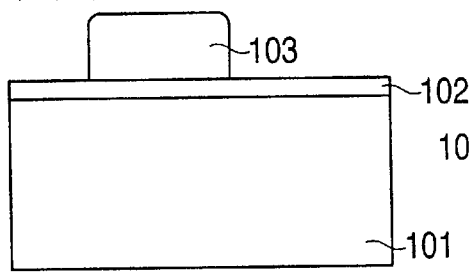
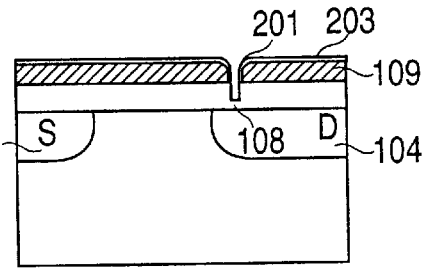
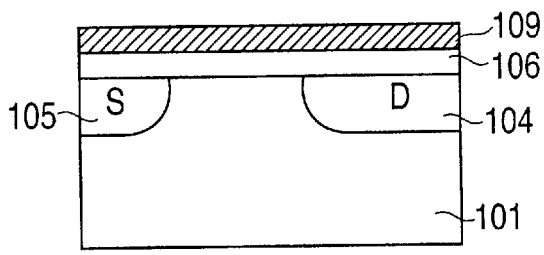
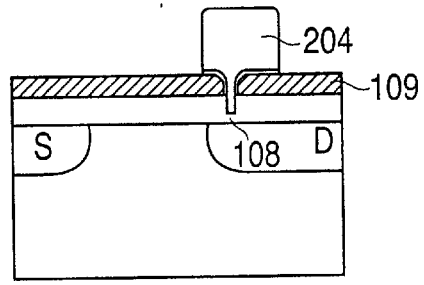
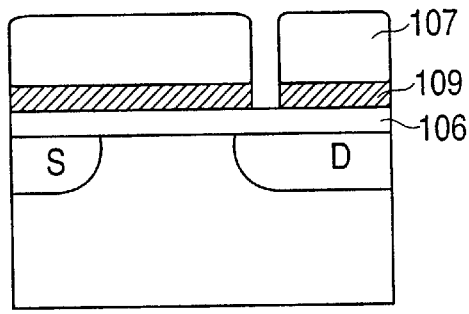
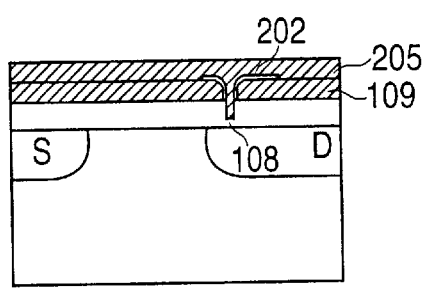
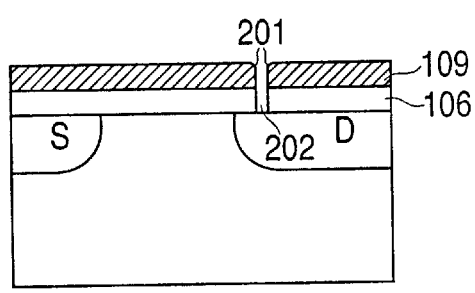
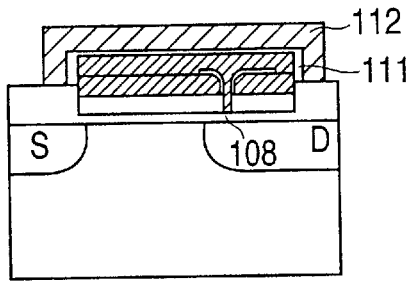

METHOD OF FABRICATING FLOATING GATE EEPROM

BACKGROUND OF THE INVENTION

1. Field of the Invention

This invention relates to a method of fabricating a non-volatile semiconductor memory which has a floating gate electrode and a control gate electrode and performs a tunnel injection and erasure through a local thin oxide area.

2. Description of the Related Art

As an electrically erasable programmable read-only memory (EEPROM) having a floating gate electrode and a control gate electrode, there has heretofore been known a non-volatile memory of a type wherein electrons are transferred between a floating gate electrode and a diffusion layer under a tunneling phenomenon through a thin gate oxide (tunnel oxide) opened or cut over the diffusion layer, whereby data is rewritten into another. A method of fabricating the above-described EEPROM will be described with reference to FIG. 1. As shown in FIG. 1A, a device isolation region is formed over a P-type silicon (Si) substrate 101 by LOCOS. Thereafter, an silicon oxide 102 is formed in a thickness of 200 Å, for example and arsenic (As) ion or the like is iimplanted to form a source and drain of an EEPROM memory cell with a resist 103 as a mask. After the oxide 102 has been removed, a gate oxide (silicon oxide) 106 is next formed in a thickness of 500 Å, for example, as shown in FIG. 1B. When a high voltage is applied to the gate oxide 106 to rewrite data into another through a gate oxide, it is necessary to form the gate oxide 106 to a thickness enough to prevent current from flowing. Afterwards, an opening is defined in a area of the gate oxide 106 on a drain diffusion layer 104 as shown in FIG. 1C. The opening will be called "tunnel window". The size of an open diameter of the tunnel window is of importance to a coupling ratio as will be described later.

After the removal of the resist 107, a tunnel oxide 108 is next formed within the tunnel window so as to have a thickness of 100 Å, for example by thermal oxidation as shown in FIG. 1D.

Thereafter, polycrystalline silicon 109, which serves as a floating gate electrode, is deposited as shown in FIGS. 2A through 2D. Afterwards, the polycrystalline silicon is etched with a resist 110 as a mask. Subsequently to its etching, an interlayer insulating film 111 is formed so as to have a thickness of 200 Å, for example and thereafter polycrystalline silicon 112 which serves as a control gate electrode, is formed and subjected to patterning, whereby each memory cell electrode for the EEPROM is formed.

Although, however, the conventional disclosed method has shown the case in which the current is fed through the tunnel oxide 108 100 Å thick, for example, to discharge an electrical charge from the floating gate electrode 109 or charge it therein, whereby data is renewed or rewritten into another, an effective voltage applied to the tunnel oxide needs 10V or higher when the tunnel oxide 108 is 100 Å thick. This case will present a problem of at what rate the voltage applied between the control gate electrode 112 and the drain 104 effectively reaches a voltage applied between the floating gate electrode 109 and the drain 104. This rate is called "coupling ratio", which is determined by the ratio of the capacitance between the control gate electrode and the floating gate electrode to the capacitance between the floating gate electrode and the drain.

As the capacitance value between the floating gate electrode and the drain is relatively small, the coupling ratio improves and the voltage which should be applied between the control gate electrode and the drain, may be low. Since the minimum value of the open diameter of the tunnel window is usually determined according to a design rule when the tunnel window is opened, the coupling ratio cannot be increased unless a memory cell is made great in particular. It was eventually necessary to apply a voltage near 20V between the control gate electrode and the drain. The need for application of such a high voltage will cause a problem in that in an LSI supplied with a normal power supply voltage of 5V or less, a gate oxide for each transistor of a peripheral circuit for driving a memory cell is made thick in thickness, the area thereof increases with its increase in thickness and the speeding down of circuit operation occurs. Since the diameter of the tunnel window cannot be set to the minimum value or less based on the design rule, the memory cell itself was accompanied by a drawback that it would increase in size to ensure allowance for alignment displacements and the coupling ratio.

SUMMARY OF THE INVENTION

An object of the present invention is to provide a method for fabricating an EEPROM, which comprises the steps of, upon opening a tunnel window, opening and removing a portion of a conductive layer used as a floating gate electrode, forming side walls on side portions of the conductive layer in the opening, removing a lower gate insulating film by a self-aligned method with each side wall as a mask to thereby expose a semiconductor substrate, and locally forming a thin tunnel insulating film within the tunnel window.

An EEPROM memory cell can be manufactured which is capable of setting the diameter of a tunnel window to a small dimension greater than or equal to a design rule, providing a large coupling ratio and lowering an applied voltage.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 3(A)–4(D) are a cross-sectional view illustrating a process for fabricating an EEPROM, according to a first embodiment of the present invention;

DESCRIPTION OF THE PREFERRED EMBODIMENTS

Figure 1A:
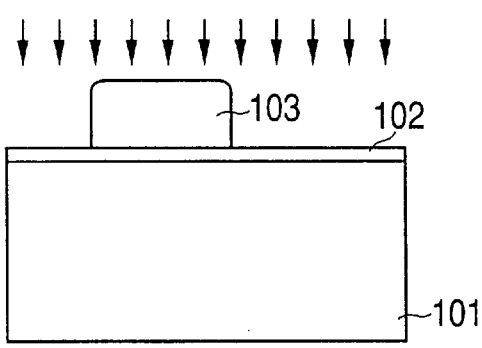
FIGS. 1(A)–2(D) are a cross-sectional view showing a process for fabricating an EEPROM, according to the prior art.
Figure 2A:
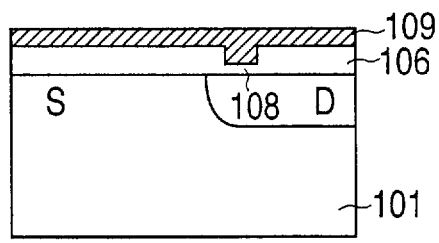
Figure 1B:
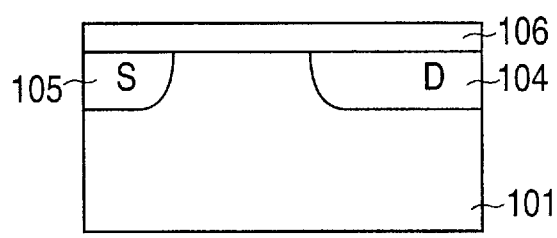
Figure 2B:
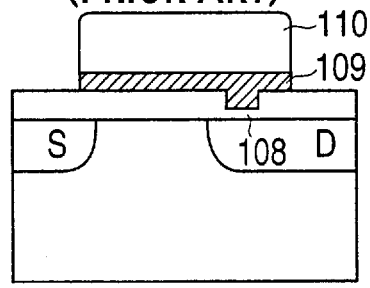
Figure 1C:
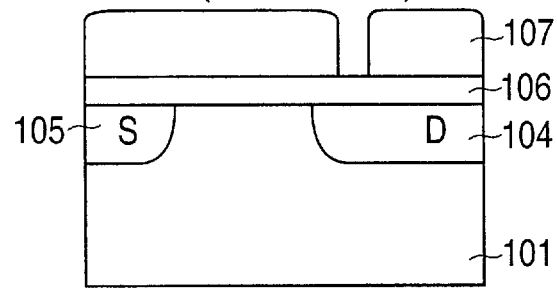
Figure 2C:
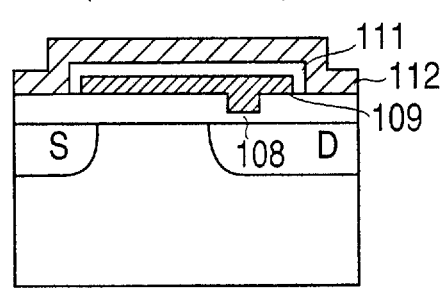
Figure 1D:
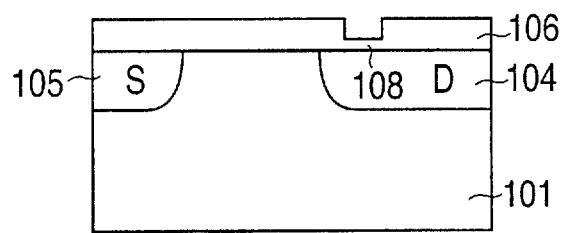
Figure 2D:
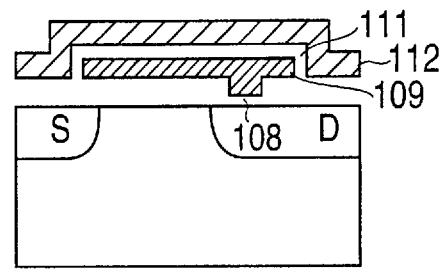

Preferred embodiments of the present invention will hereinafter be described with reference to the accompanying drawings.

[First Embodiment]

A first embodiment of the present invention will first be described with reference to FIG. 3 and FIG. 4. In FIGS. 3A and 3B, a device isolation region, an silicon oxide 102 having a thickness of 200 Å, a source-drain diffusion region or layer, a gate oxide (silicon oxide) 106 having a thickness of 500 Å, and polycrystalline silicon 109 are successively formed over a P-type silicon (Si) substrate 101. An opening is next defined in the polycrystalline silicon 109 through a resist 107 in FIG. 3C. At this time, the gate oxide 106 is left as it is without its removal. As shown in FIG. 3D, side walls 201 are formed in the opening of the polycrystalline silicon 109 by deposition and etchback of the polycrystalline silicon 109 after removal of the resist 107. Thereafter, the gate oxide 106 is removed by a self-aligned method with the side walls 201 as masks, whereby a small tunnel window 202 is defined. Afterwards, a tunnel oxide 108 is formed by thermal oxidation so as to have a thickness of 100 Å as shown in FIG. 4A. At this time, an oxide 203 is simultaneously formed over the polycrystalline silicon 109 and the side walls 201 of the polycrystalline silicon 109. Next, as shown in FIG. 4B, the oxide 203 on the polycrystalline silicon 109 is removed while the tunnel window 202 is being protected by a resist 204. After its removal, polycrystalline silicon 205 is deposited over the polycrystalline silicon 109 as shown in FIG. 4C so as to conduct into or make continuity for the polycrystalline silicon 109 and serve as a floating gate electrode in the tunnel window 202. Thereafter, as shown in FIG. 4D, the floating gate electrode comprised of the polycrystalline silicon 205 and the polycrystalline silicon 109 is patterned to form an interlayer insulating film 111 200 Å thick, for example, followed by formation of a control gate electrode 112.

Although the side walls are formed of the polycrystalline silicon used as the conductive layer in the first embodiment of the present invention, they may be formed by an insulating film such as a silicon nitride film or the like.

[Second Embodiment]

Figure 5A:
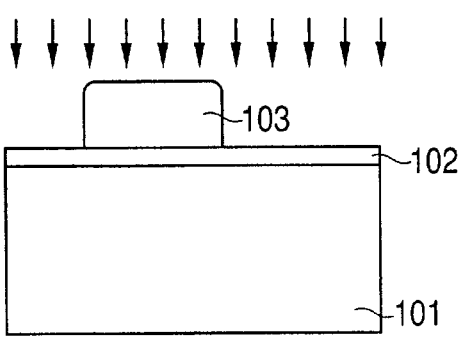
FIGS. 5(A)–6(D) are a cross-sectional view depicting a process for fabricating an EEPROM, according to a second embodiment of the present invention.
Figure 5B:
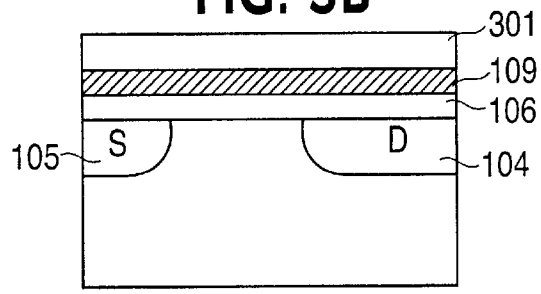
Figure 6B:
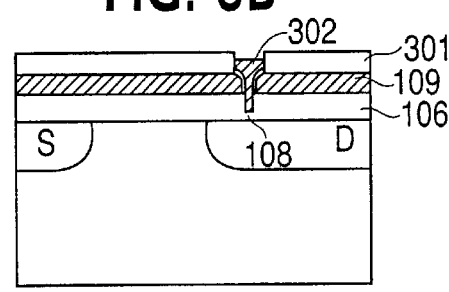
Figure 5C:
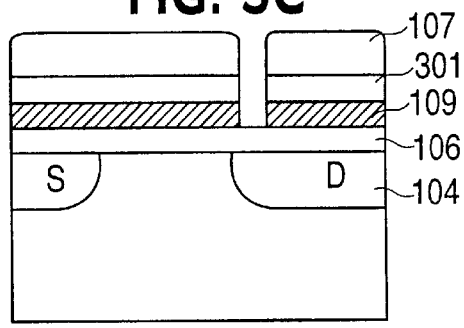

A second embodiment of the present invention will next be described with reference to FIG. 5 and FIG. 6. In FIGS. 5A through 5C in a manner similar to the first embodiment, a device separation region, a source/drain diffusion layer and a gate oxide (silcon oxide) 106 are formed over a P-type silicon (Si) substrate in a thickness of 500 Å, and polycrystalline silicon 109 and an silicon oxide 301 are formed thereon in a thickness of 3000 Å, for example, respectively. An opening is defined in the oxide 301 and the polycrystalline silicon 109 through a resist 107. After the resist 107 has been removed, side walls 201 are formed within a tunnel window 202 by polycrystalline silicon or a silicon nitride film in FIG. 5D. Thereafter, the tunnel window 202 is opened through the gate oxide 106 by a self-aligned method with each side wall 201 as a mask. Although the oxide 301 is also etched at this time, all of the oxide 301 is not removed because it is deposited thick.

Figure 6A:
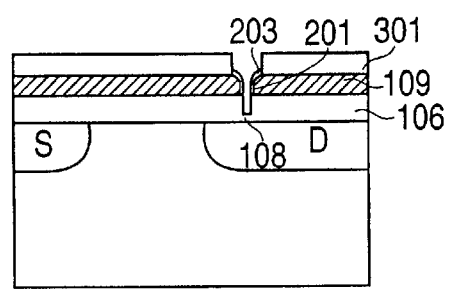
Figure 6C:
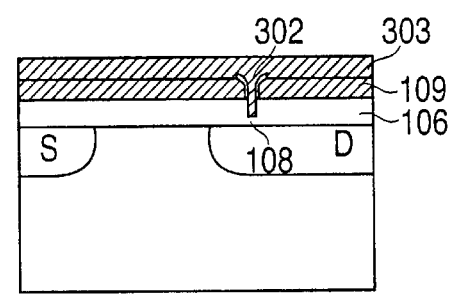
Figure 5D:
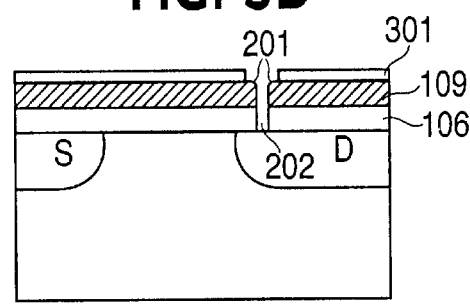
Figure 6D:
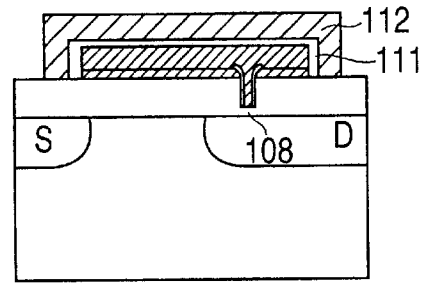

Thereafter, a tunnel oxide 108 is subjected to thermal oxidation so as to take 100 Å in thickness as shown in FIG. 6A. At this time, an oxide 203 is formed on the side walls 201 when the side walls are formed by the polycrystalline silicon. Polycrystalline silicon 302 is next embedded in the tunnel window 202 by depositing and etching back the polycrystalline silicon in FIG. 6B. Thereafter, as shown in FIG. 6C, the remaining oxide 301 on the polycrystalline silicon 109 is removed and thereafter polycrystalline silicon 303 is deposited. Further, the polycrystalline silicon 303 is brought into conduction into the polycrystalline silicon 302 and the polycrystalline silicon 109 in the tunnel window 202. Thereafter, as shown in FIG. 6D, an interlayer insulating film 111 and a control gate electrode 112 are formed after the polycrystalline silicon 303 and the polycrystalline silicon 109 have been patterned.

[Third Embodiment]

Figure 7A:
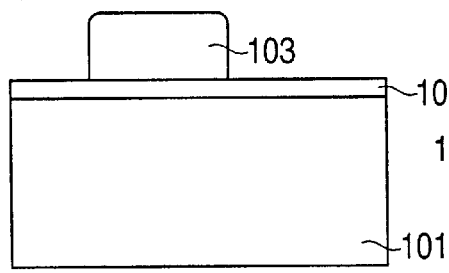
FIGS. 7(A)–8(D) are a cross-sectional view showing a process for fabricating an EEPROM, according to a third embodiment of the present invention.
Figure 7B:
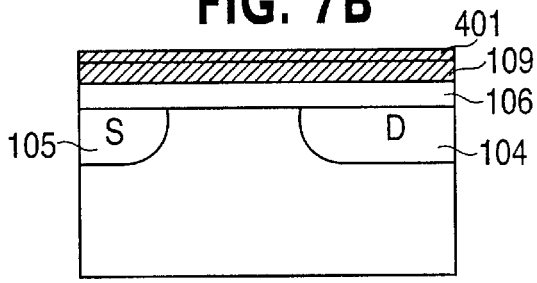
Figure 7C:
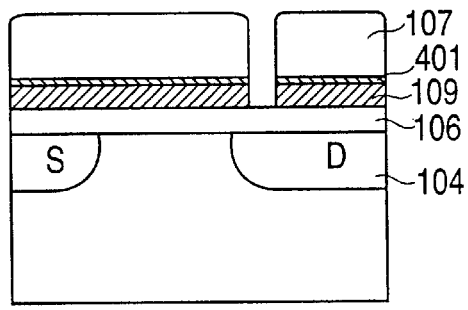

A third embodiment of the present invention will next be described with reference to FIG. 7 and FIG. 8. In FIGS. 7A through 7C in a manner similar to the first embodiment, a device separation region, a source/drain diffusion layer and a gate oxide (silicon oxide) 106 are formed over a P-type silicon (Si) substrate in a thickness of 500 Å, and polycrystalline silicon 109 and a silicon nitride film 401 used as an oxidation barrier film are formed thereon in a thickness of 200 Å, for example, respectively. An opening is defined in the silicon nitride film 401 and the polycrystalline silicon 109 through a resist 107. After the resist 107 has been removed, side walls 201 are formed within a tunnel window 202 in FIG. 7D. Thereafter, the tunnel window 202 is opened through the gate oxide 106 by a self-aligned method with each side wall 201 as a mask.

Figure 8A:
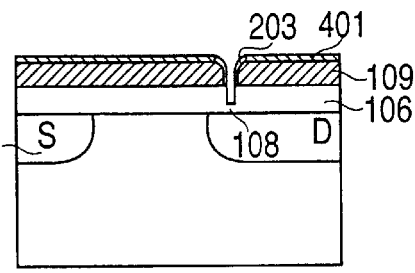
Figure 8B:
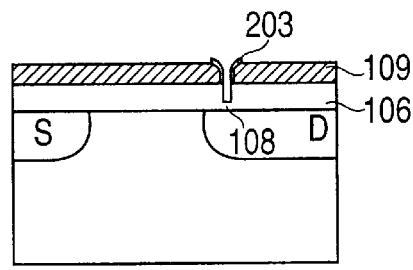
Figure 8C:
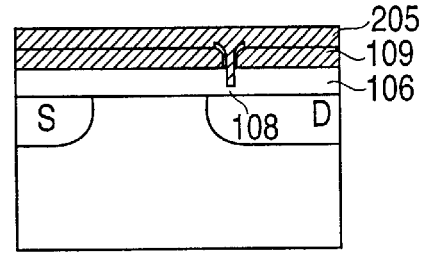
Figure 7D:
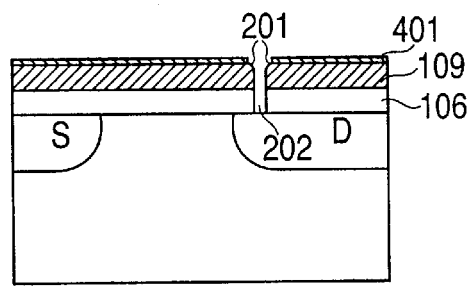
Figure 8D:
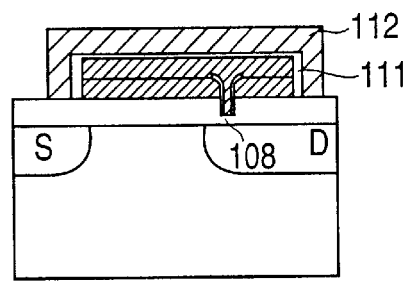

Thereafter, a tunnel oxide 108 is subjected to thermal oxidation so as to take 100 Å in thickness as shown in FIG. 8A. At this time, an oxide is hardly formed over the silicon nitride film 401 used as the oxidation barrier film. As shown in FIG. 8B, the silicon nitride film 401 is selectively removed by a solution of thermal phosphoric acid or the like. Thereafter, as shown in FIG. 8C, polycrystalline silicon 402 is deposited so as to conduct into the polycrystalline silicon 109. Afterwards, as shown in FIG. 8D, an interlayer insulating film 111 and a control gate electrode 112 are formed after the polycrystalline silicon 402 and the polycrystalline silicon 109 have been patterned.

According to the present invention as has been described above, an EEPROM can be manufactured which is capable of setting the diameter of a tunnel window to a design rule or less, providing a high coupling ratio and a low applied voltage and allowing a low voltage. Further, an EEPROM small in area and capable of high-speed operation can be manufactured because each memory cell in the EEPROM can be reduced in size due to a reduction in the diameter of a tunnel window and a withstand voltage required for a peripheral circuit due to the provision of a low voltage becomes low.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of fabricating a MOS transistor having a floating gate electrode and provided with a thin film area for injection of a tunneling current into said floating gate electrode, comprising:

forming a first insulating film and a first conductive layer sequentially over a semiconductor substrate;

removing an area of said first conductive layer to define an opening in said first conductive layer which exposes said first insulating film;

forming side walls within said opening;

removing said first insulating film lying within said opening using said side walls as a mask to expose said semiconductor substrate;

selectively forming a second insulating film over a surface portion of said first conductive layer including said opening;

forming a second conductive layer over said second insulating film and said first conductive layer; and etching said first and second conductive layers to form a floating gate electrode.

2. The method according to claim 1, wherein said first insulating film and said second insulating film each comprise an silicon oxide.

3. The method according to claim 1, wherein said first conductive layer and said second conductive layer are polycrystalline silicon.

4. The method according to claim 1, wherein said side walls each comprise polycrystalline silicon or a silicon nitride film.

5. A method of fabricating a MOS transistor having a floating gate electrode and provided with a thin film area for injection of a tunneling current into said floating gate electrode, comprising:

successively forming a first insulating film, a first conductive layer and a second insulating film over a semiconductor substrate;

removing an area of said second insulating film and a corresponding area of said first conductive layer to define an opening in said second insulating film and said first conductive layer which exposes said first insulating film;

forming side walls within said opening;

removing said first insulating film lying within said opening using said side walls as a mask to expose said semiconductor substrate;

selectively forming a third insulating film over an area including said side walls within said opening;

selectively forming a second conductive layer within only said opening;

removing said second insulating film;

forming a third conductive layer over said first and second conductive layers; and etching said first and third conductive layers to form a floating gate electrode.

6. The method according to claim 5, wherein said first insulating film and said second insulating film each comprise an silicon oxide.

7. The method according to claim 5, wherein said first through said third conductive layers each comprise polycrystalline silicon.

8. The method according to claim 5, wherein said side walls each comprise polycrystalline silicon or a silicon nitride film.

9. A method of fabricating a MOS transistor having a floating gate electrode and provided with a thin film area for injection of a tunneling current into said floating gate electrode, comprising:

successively forming a first insulating film, a first conductive layer, and a second insulating film which is an oxidation barrier over a semiconductor substrate;

removing an area of said second insulating film and a corresponding area of said first conductive layer to define an opening in said second insulating film and said first conductive layer which exposes said first insulating film;

forming said side walls within said opening;

removing said first insulating film lying within said opening using said side walls as a mask to expose said semiconductor substrate selectively forming a third insulating film over an area including said side walls within said opening;

removing said second insulating film;

forming a second conductive layer over ever said third insulating film and said first conductive layer; and etching said first and second conductive layers to form a floating gate electrode.

10. The method according to claim 9, wherein said first insulating film and said third insulating film each comprise an silicon oxide.

11. The method according to claim 9, wherein said second insulating film is a silicon nitride film.

12. The method according to claim 9, wherein said first conductive layer and said second conductive layer each comprise polycrystalline silicon.

13. The method according to claim 9, wherein said side walls each comprise polycrystalline silicon or a silicon nitride film.

* * * * *